United States Patent
Komoto et al.

(10) Patent No.: US 9,647,364 B2
(45) Date of Patent: May 9, 2017

(54) THIN CONNECTOR

(71) Applicant: Japan Aviation Electronics Industry, Limited, Tokyo (JP)

(72) Inventors: Tetsuya Komoto, Tokyo (JP); Yu Tatebe, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 15/078,420

(22) Filed: Mar. 23, 2016

(65) Prior Publication Data

US 2016/0359249 A1    Dec. 8, 2016

(30) Foreign Application Priority Data

Jun. 8, 2015 (JP) ................... 2015-115744

(51) Int. Cl.
*H01R 12/72* (2011.01)
*H05K 1/11* (2006.01)
*H01R 12/71* (2011.01)

(52) U.S. Cl.
CPC ......... *H01R 12/721* (2013.01); *H01R 12/718* (2013.01); *H01R 12/727* (2013.01); *H05K 1/117* (2013.01)

(58) Field of Classification Search
CPC .. H01R 12/718; H01R 12/721; H01R 12/727; H05K 2201/10386; H05K 3/403; H05K 3/4092; H05K 3/326; H05K 3/368; H05K 1/117; H05K 3/4007
USPC ....................................................... 439/629
See application file for complete search history.

(56) References Cited

U.S. PATENT DOCUMENTS

| | | | | |
|---|---|---|---|---|
| 6,462,281 B2 * | 10/2002 | Uchida | ............ | H01H 51/281 |
| | | | | 174/138 F |
| 7,674,114 B2 * | 3/2010 | Tanaka | ............ | H01R 12/57 |
| | | | | 439/74 |
| 8,439,689 B2 * | 5/2013 | Niitsu | ............ | H01R 12/65 |
| | | | | 439/65 |
| 9,318,820 B2 * | 4/2016 | Niitsu | ............ | H01R 12/79 |
| 2014/0295697 A1 | 10/2014 | Nitsu et al. | | |

FOREIGN PATENT DOCUMENTS

JP          2014191952 A    10/2014

* cited by examiner

*Primary Examiner* — Renee Luebke
*Assistant Examiner* — Paul Baillargeon
(74) *Attorney, Agent, or Firm* — Muncy, Geissler, Olds & Lowe, P.C.

(57) ABSTRACT

A thin connector includes a first connector and a second connector both having a flat plate shape, the first connector includes first conductive layers disposed on a first insulating layer and superimposed on one another via an intermediate insulating layer, each first conductive layer has a spring contact array, among the first conductive layers, a first conductive layer closer to the first insulating layer has the spring contact array disposed more frontward in the fitting direction while a first conductive layer farther from the insulating layer has the spring contact array disposed more rearward in the fitting direction, the second connector includes a single second conductive layer disposed on a second insulating layer, the second conductive layer has projection arrays, among the projection arrays, a projection array disposed more frontward in the fitting direction are lower while a projection array disposed more rearward in the fitting direction are higher.

9 Claims, 9 Drawing Sheets

FIG. 8
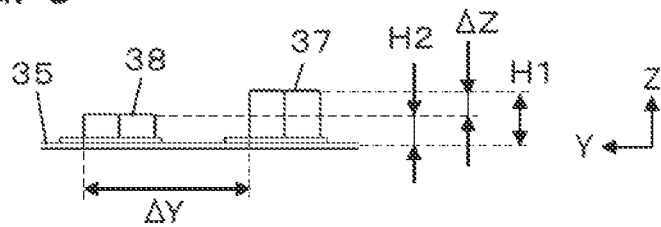
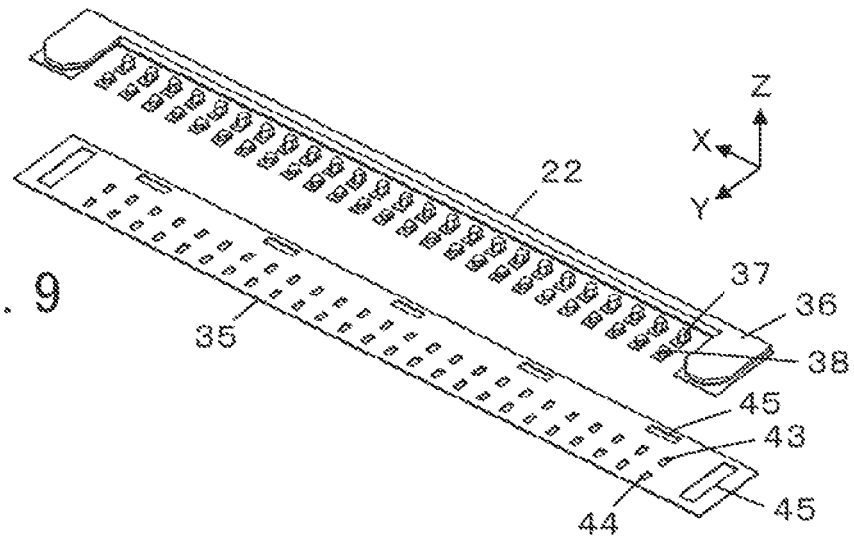
FIG. 9
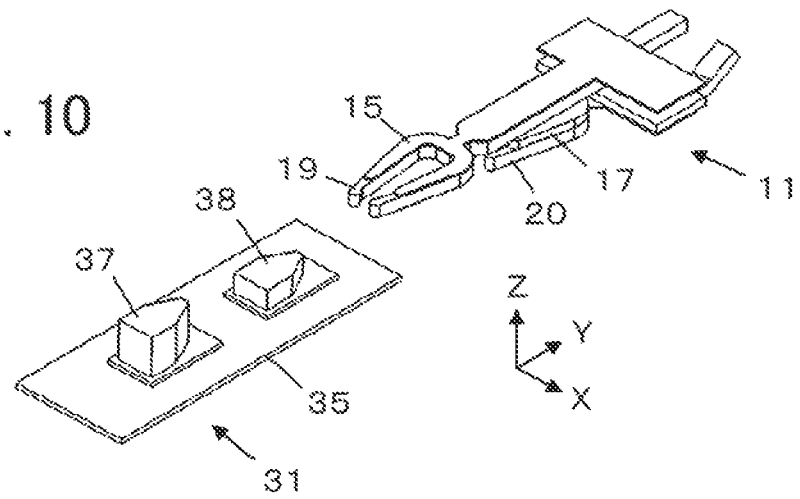
FIG. 10

FIG. 11
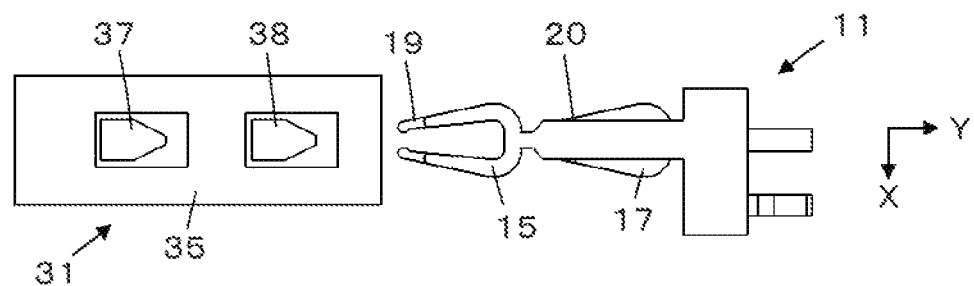
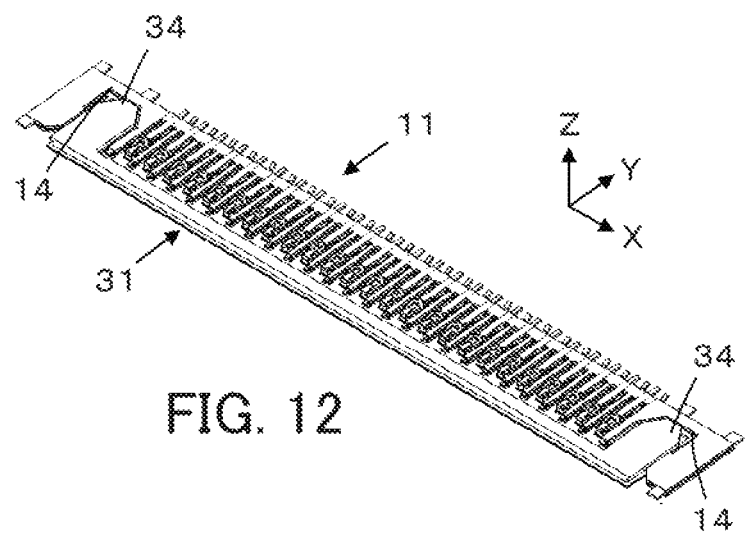
FIG. 12
FIG. 13
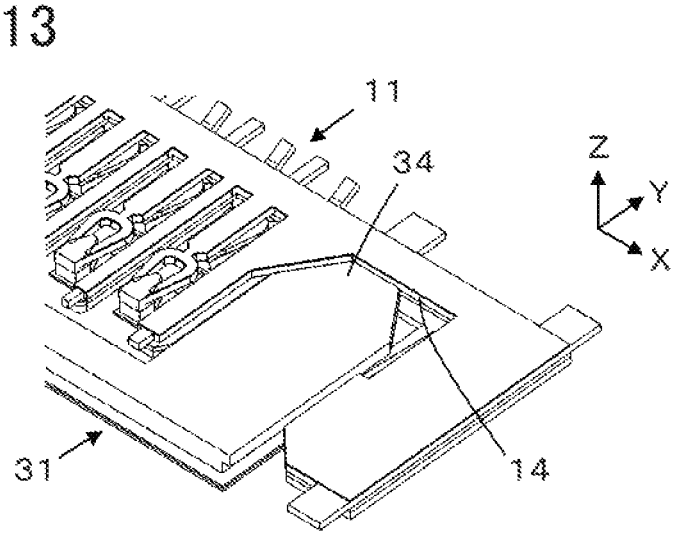

PRIOR ART

THIN CONNECTOR

BACKGROUND OF THE INVENTION

The present invention relates to a thin connector, in particular, to a thin connector comprising a first connector having a flat plate shape and a second connector having a flat plate shape, the first connector and the second connector sliding on each other in a fitting direction to be fitted with each other.

As a connector of this type, for example, JP 2014-191952 A discloses a connector in which a connecting portion 3 of a plate-like cable 2 is to be connected to a multi-layer board 1, as illustrated in FIG. 17. The multi-layer board 1 includes a plurality of columnar terminals 4 arranged in an array, and the connecting portion 3 of the plate-like cable 2 includes a plurality of plate-like terminals 5 arranged in an array, as illustrated in FIG. 18.

When the connecting portion 3 of the plate-like cable 2 is inserted into the multi-layer board 1 through an insertion opening 1A of the multi-layer board 1, the plate-like terminals 5 disposed in the connecting portion 3 of the plate-like cable 2 respectively come into contact with the columnar terminals 4 of the multi-layer board 1, whereby connection between the multi-layer board 1 and the plate-like cable 2 is established.

In order to increase the number of contacts while the width dimension of the multi-layer board 1 in the arrangement direction of the columnar terminals 4 is kept unchanged, however, a plurality of plate-like cables 2 are required to be connected to a multi-layer board 6 having the increased number of layers as shown in FIG. 19, and, as a result, there arises a problem that the operability of the connector is impaired.

SUMMARY OF THE INVENTION

The present invention has been made in order to solve the conventional problem described above and is aimed at providing a thin connector which is capable of achieving an increase in the number of contacts, only through a fitting between a single first connector and a single second connector, without increasing the width dimension thereof in a direction orthogonal to the fitting direction of the first connector and the second connector.

A thin connector according to the present invention comprises a first connector having a flat plate shape and a second connector having a flat plate shape, the first connector and the second connector sliding on each other in a fitting direction to be fitted with each other, wherein the first connector includes a plurality of first conductive layers disposed on a first insulating layer and superimposed on one another via an intermediate insulating layer, wherein each of the first conductive layers has a spring contact array including a plurality of spring contacts arranged in an arrangement direction crossing the fitting direction, wherein, among the plurality of first conductive layers, a first conductive layer closer to the first insulating layer has the spring contact array disposed more frontward in the fitting direction while a first conductive layer farther from the insulating layer has the spring contact array disposed more rearward in the fitting direction, wherein the plurality of spring contacts in the spring contact array have spring properties capable of shifting in the arrangement direction and are provided with mounting portions to be connected to a single first connection subject, wherein the second connector includes a single second conductive layer disposed on a second insulating layer, wherein the second conductive layer has a plurality of projection arrays disposed so as to be shifted from one another in the fitting direction, each of the projection arrays including a plurality of projections arranged in the arrangement direction, wherein, among the plurality of projection arrays, the plurality of projections in a projection array disposed more frontward in the fitting direction have lower heights while the plurality of projections in a projection array disposed more rearward in the fitting direction have higher heights, wherein the plurality of projections in the projection arrays are provided with mounting portions to be connected to a single second connection subject, and wherein, when the first connector and the second connector are fitted with each other with the first insulating layer and the second insulating layer both facing outward, the plurality of spring contacts in each of the spring contact arrays of the first connector are connected to the plurality of projections in a corresponding projection array of the second connector.

BRIEF DESCRIPTION OF THE DRAWINGS

FIG. 8 is a side view of a first projection and a second projection of the plug.

FIG. 9 is an exploded view of the plug.

FIG. 10 is a perspective view of the first spring contact and the second spring contact of the receptacle and the first projection and the second projection of the plug before fitting.

FIG. 11 is a plan view of the first spring contact and the second spring contact of the receptacle and the first projection and the second projection of the plug before fitting.

FIG. 12 is a perspective view of the receptacle and the plug as being fitted with each other.

FIG. 13 is an enlarged view of a main part of FIG. 12.

DETAILED DESCRIPTION OF THE INVENTION

An embodiment of the present invention is described below based on the appended drawings.

Figure 1:
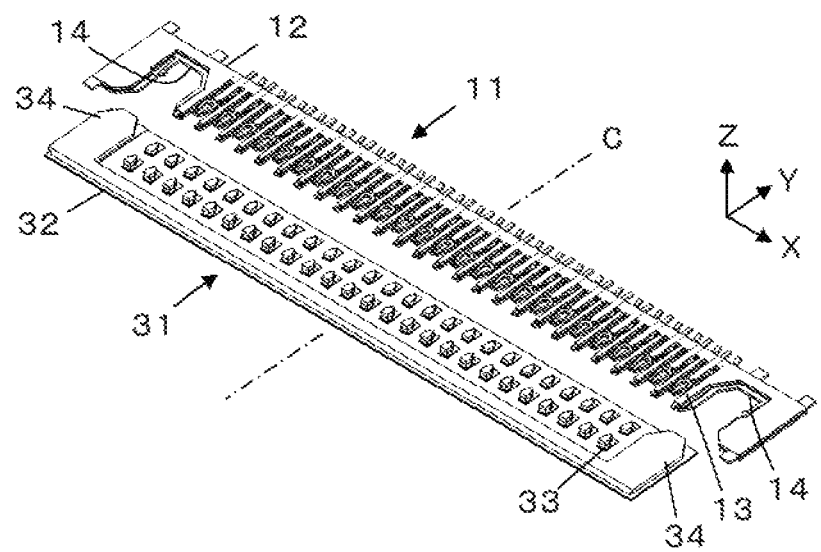
FIG. 1 is a perspective view of a receptacle and a plug of a thin connector before fitting, according to an embodiment of the present invention.

FIG. 1 illustrates a configuration of a thin connector according to an embodiment of the present invention. The thin connector comprises a flat plate receptacle (first connector) 11 and a flat plate plug (second connector) 31, and the receptacle 11 and the plug 31 slide on each other in a fitting direction along a fitting axis C to be fitted with each other. FIG. 1 illustrates the receptacle 11 and the plug 31 before fitting, the receptacle 11 and the plug 31 being placed in parallel with each other via an interval.

The receptacle 11 includes a receptacle main body 12 extending in a direction orthogonal to the fitting axis C and a plurality of spring contacts 13 held by the receptacle main body 12 and arranged in two arrays in a direction orthogonal to the fitting axis C. Meanwhile, the plug 31 includes a plug main body 32 extending in a direction orthogonal to the fitting axis C and a plurality of projections 33 held by the plug main body 32 and arranged in two arrays in a direction orthogonal to the fitting axis C.

The receptacle main body 12 is provided at its opposite end parts respectively with a pair of aligning recesses 14 that lie along the fitting axis C and open toward the plug 31, and the plug main body 32 is provided at its opposite end parts respectively with a pair of aligning protrusions 34 that lie along the fitting axis C and protrude toward the receptacle 11.

Figure 2:
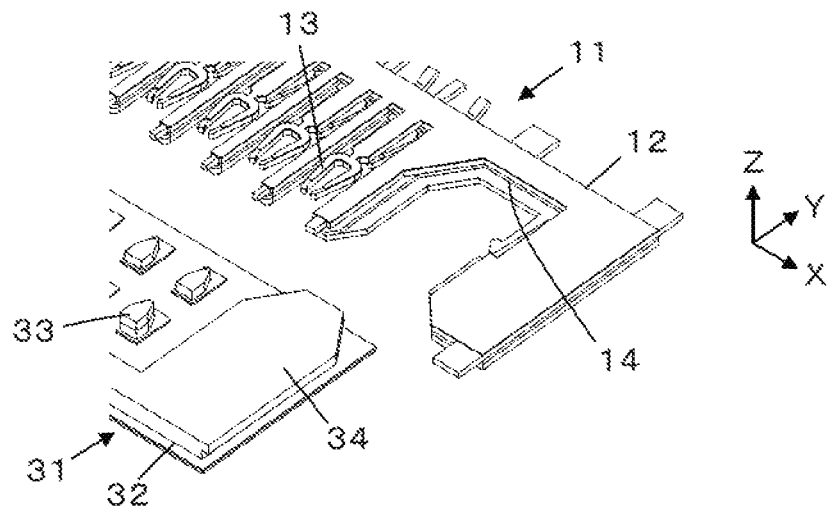
FIG. 2 is an enlarged view of a main part of FIG. 1.

As illustrated in FIG. 2, since an aligning recess 14 has a shape corresponding to that of an aligning protrusion 34, the pair of aligning protrusions 34 are respectively caught in the pair of aligning recesses 14 so that the receptacle 11 and the plug 31 are aligned at the time of fitting.

For convenience, a plane along which the flat plate receptacle 11 and plug 31 extend is referred to as XY plane, an arrangement direction of the spring contacts 13 and the projections 33 as X direction, a direction from the plug 31 toward the receptacle 11 along the fitting axis C as +Y direction, and a direction perpendicular to the XY plane and in which the projections 33 each project as +Z direction.

Looking from the receptacle 11 side, the −Y direction comes to the front in the fitting direction to be fitted with the plug 31, and looking from the plug 31 side, the +Y direction comes to the front in the fitting direction to be fitted with the receptacle 11.

Figure 3A:
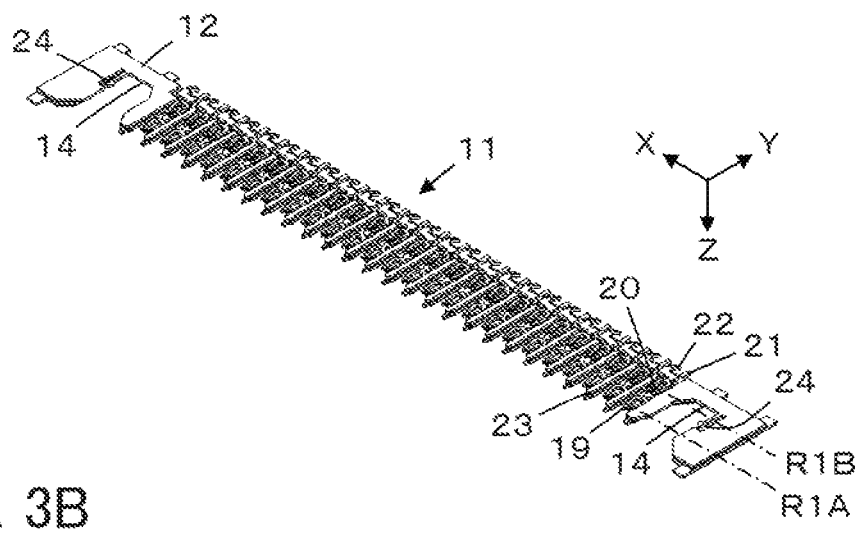
FIGS. 3A to 3D are a perspective view, a plan view, a bottom view and an enlarged side view, each showing the receptacle used in the embodiment.
Figure 3B:
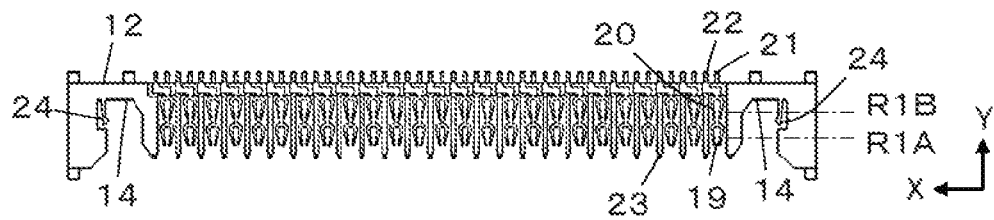
Figure 3C:
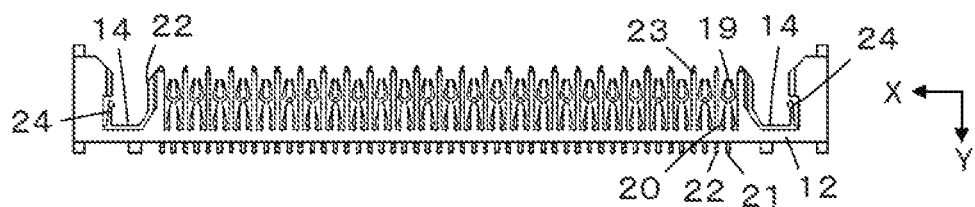

A configuration of the receptacle 11 is illustrated in FIGS. 3A to 3D. FIG. 3A shows the receptacle 11 illustrated in FIG. 1 but in the upside down state such that the +Z direction comes to the lower side.

Figure 3D:
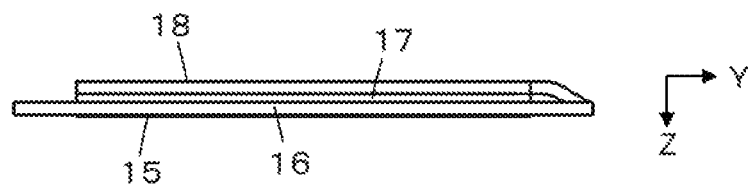
Figure 4A:
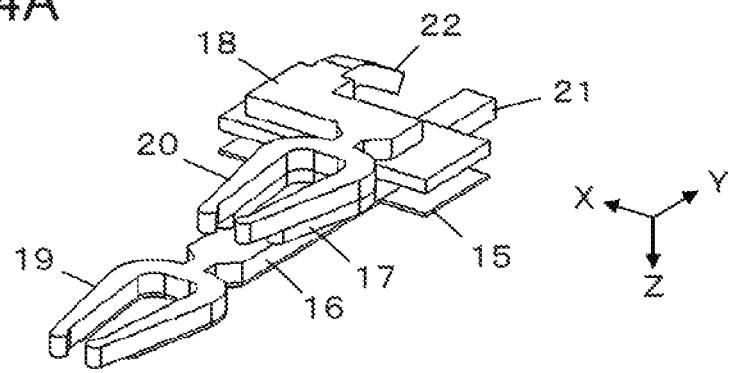
FIGS. 4A to 4D are a perspective view, a plan view, a side view and a bottom view, each showing a first spring contact and a second spring contact of the receptacle.
Figure 4B:
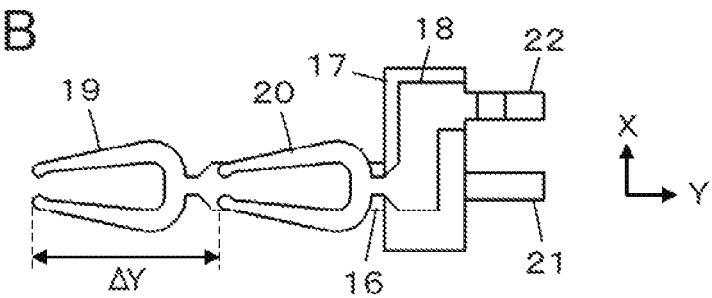
Figure 4C:
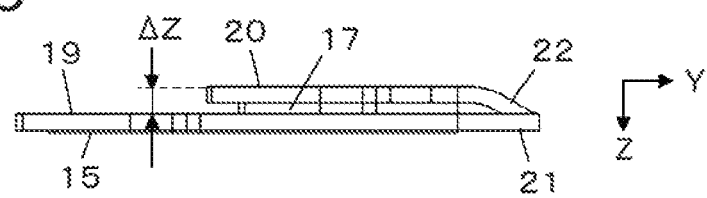
Figure 4D:
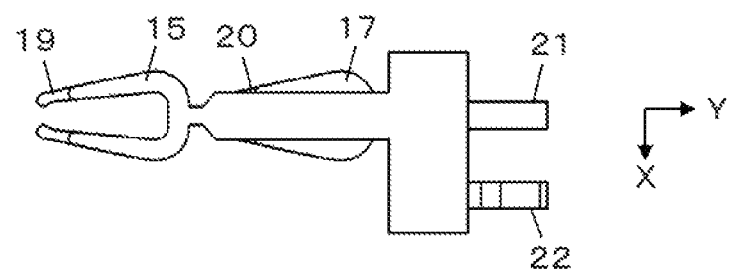

As illustrated in FIG. 3D, the receptacle 11 has a four-layer structure in which a first insulating layer 15, a first conductive layer (first metallic layer) 16, an intermediate insulating layer 17, and another first conductive layer (second metallic layer) 18 are superimposed in this order in the −Z direction.

The first metallic layer 16 disposed on the surface of the first insulating layer 15 on the −Z direction side has a first spring contact array R1A including a plurality of first spring contacts 19 arranged in the X direction, while the second metallic layer 18 disposed on the surface of the intermediate insulating layer 17 on the −Z direction side has a second spring contact array R1B including a plurality of second spring contacts 20 arranged in the X direction.

Among the first and second metallic layers 16 and 18, the first metallic layer 16 that is closer to the first insulating layer 15 has the first spring contact array R1A disposed more frontward in the fitting direction, i.e., on the −Y direction side, than the second spring contact array R1B of the second metallic layer 18 that is farther from the first insulating layer 15.

The first spring contacts 19 and second spring contacts 20 each extend in the Y direction. The first spring contact 19 is provided at the end thereof on the +Y direction side with a mounting portion 21, while the second spring contact 20 is provided at the end thereof on the +Y direction side with a mounting portion 22. The mounting portions 21 and 22 are connected to pads of a first connection subject (not shown) such as a board, on which the receptacle 11 is mounted, and project from the receptacle main body 12 in the +Y direction.

The receptacle main body 12 is provided with a plurality of spring contact protecting portions 23 that each extend in the −Y direction along the fitting direction between the adjacent first spring contacts 19 and between the adjacent second spring contacts 20. Each of the spring contact protecting portions 23 projects in the fitting direction more frontward than the first and second spring contacts 19 and 20.

In addition, in the receptacle main body 12, a lock portion 24 is provided in each of the pair of aligning recesses 14 so as to be capable of shifting in the X direction.

As illustrated in FIGS. 4A to 4D, a first spring contact 19 formed in the first metallic layer 16 and a second spring contact 20 formed in the second metallic layer 18 are aligned in the Y direction and have spring properties capable of shifting in the X direction that is the arrangement direction of the first spring contacts 19 and of the second spring contacts 20. Moreover, the second spring contact 20 is disposed at the position shifted from the position of the first spring contact 19 on the +Y direction side by an amount of ΔY and on the −Z direction side by an amount of ΔZ.

In the meantime, the intermediate insulating layer 17 is disposed between the first spring contact 19 and the second spring contact 20 so that the first spring contact 19 is insulated from the second spring contact 20.

Figure 5:
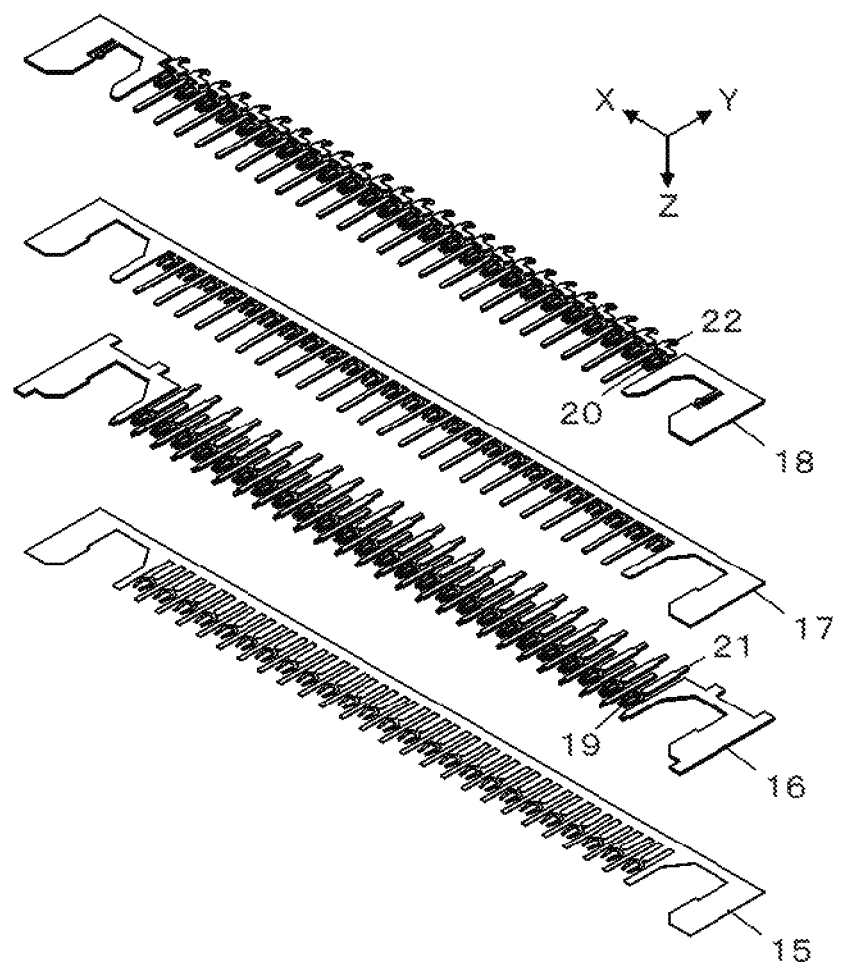
FIG. 5 is an exploded view of the receptacle.

As shown in FIG. 5, the receptacle 11 having such configuration can be produced through the steps of forming the second metallic layer 18 having the second spring contacts 20 and the mounting portions 22 by plating the surface of the intermediate insulating layer 17 having undergone etching process, forming the first metallic layer 16 having the first spring contacts 19 and the mounting portions 21 by plating the surface of the first insulating layer 15 having undergone etching process, and pasting the layers together.

Note that the first and second metallic layers 16 and 18 can be also formed by etching, in place of plating.

A configuration of the plug 31 is illustrated in FIGS. 6A to 6D. The plug 31 has a two-layer structure in which a second insulating layer 35 and a second conductive layer 36 are superimposed.

The second conductive layer 36 includes: a conductive portion 36A extending in the X direction and provided at opposite ends thereof with aligning protrusions 34, respectively; a first projection array R2A including a plurality of first projections 37 arranged in the X direction; and a second projection array R2B including a plurality of second projections 38 arranged in the X direction, the second projection array R2B being disposed more frontward in the fitting direction, i.e., on the +Y direction side, than the first projection array R2A. The first and second projections 37 and 38 project from the surface of the second insulating layer 35 on the +Z direction side.

Figure 6A:
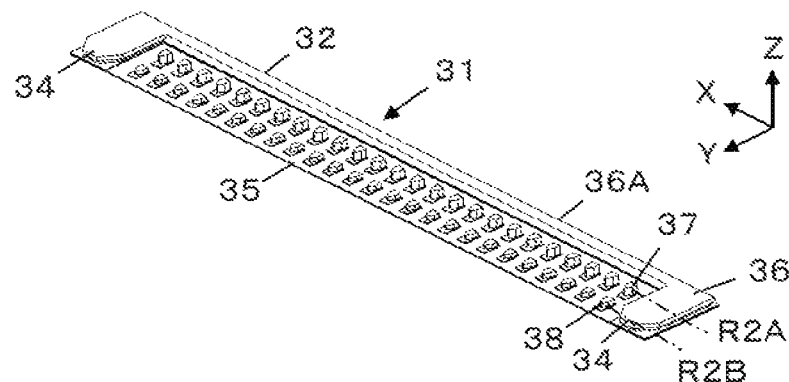
FIGS. 6A to 6D are a perspective view, a plan view, a bottom view and an enlarged side view, each showing a plug used in the embodiment.
Figure 6B:
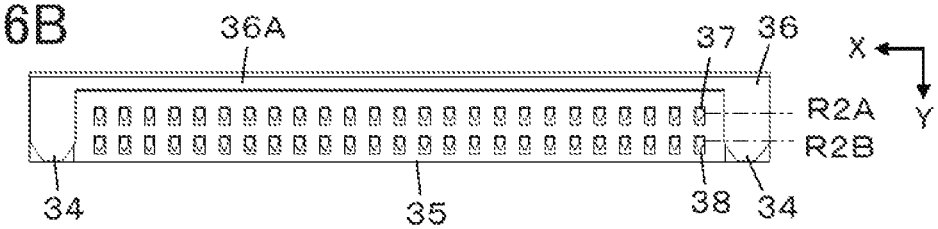
Figure 6C:
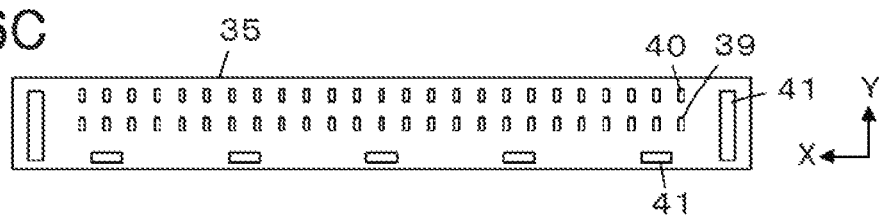

As illustrated in FIG. 6C, each of the first projections 37 is provided on the −Z direction side with a mounting portion 39, while each of the second projections 38 is provided on the −Z direction side with a mounting portion 40. The mounting portions 39 and 40 are connected to pads of a second connection subject (not shown) such as a board, on which the plug 31 is mounted.

The conductive portion 36A, together with the second insulating layer 35, constitutes a plug main body 32 and has a plurality of mounting portions 41 on the −Z direction side.

Figure 6D:
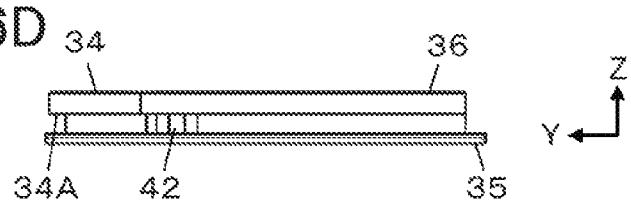
Figure 7:
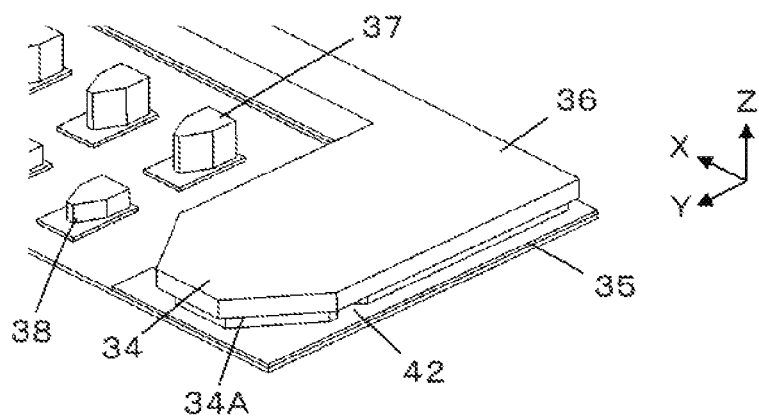
FIG. 7 is an enlarged perspective view of a main part of the plug.

Each of the aligning protrusions 34 formed at the opposite ends of the conductive portion 36A in the X direction has a taper shape tapering frontward in the fitting direction, i.e., in the +Y direction and is provided with a recess-like lock receiving portion 42 at its end in the X direction on the side away from the first and second projections 37 and 38, as illustrated in FIGS. 6D and 7. Moreover, each of the aligning protrusions 34 is provided with an overhanging portion 34A that overhangs in the XY plane in parallel to the second insulating layer 35.

As illustrated in FIG. 7, the first and second projections 37 and 38 project from the surface of the second insulating layer 35 in the +Z direction, and the first projections 37 are aligned with the second projections 38 one-by-one in the Y direction. As illustrated in FIG. 8, each of the second projections 38 is disposed at the position shifted from the aligned first projection 37 in the +Y direction by an amount of $\Delta Y$. In addition, the first projections 37 have a height H1 while the second projections 38 have a height H2 such that the second projections 38 are formed to be lower than the first projections 37 by an amount of $\Delta Z = H1 - H2$.

The plug 31 having such configuration can be produced through the step of forming the second conductive layer 36 by plating the surface of the second insulating layer 35 that is provided in advance with a plurality of through-holes 43, 44 and 45 corresponding to the mounting portions 39, 40 and 41, respectively, as illustrated in FIG. 9.

The mounting portions 39, 40 and 41 are exposed on the −Z direction side of the second insulating layer 35 via the through-holes 43, 44 and 45.

Note that the second conductive layer 36 can be formed also by etching, in place of plating.

FIGS. 10 and 11 illustrate the positional relation among a first spring contact 19 and a second spring contact 20 of the receptacle 11 and a first projection 37 and a second projection 38 of the plug 31 before fitting, when the receptacle 11 and the plug 31 oppose each other in the Y direction such that the first insulating layer 15 of the receptacle 11 faces in the +Z direction while the second insulating layer 35 of the plug 31 faces in the −Z direction. The first spring contact 19 and the second spring contact 20 of the receptacle 11 are aligned with the first projection 37 and the second projection 38 of the plug 31 in the Y direction. Moreover, since the second spring contact 20 is disposed at the position shifted from the first spring contact 19 in the −Z direction by an amount of $\Delta Z$ in the receptacle 11, and the second projection 38 is formed to be lower than the first projection 37 by an amount of $\Delta Z$ in the plug 31, the second spring contact 20 of the receptacle 11 and the second projection 38 of the plug 31 are located at almost the same position in the Z direction when the receptacle 11 and the plug 31 oppose each other such that the surface of the first spring contact 19 on the +Z direction side and the surface of the first projection 37 on the +Z direction side are located at almost the same position in the Z direction.

In this positional relation, as illustrated in FIG. 12, the plug 31 is slid on the receptacle 11 in the +Y direction, causing the pair of aligning protrusions 34 of the plug 31 to be caught in the pair of aligning recesses 14 of the receptacle 11, whereby the receptacle 11 and the plug 31 are fitted with each other.

At this time, since each of the aligning protrusions 34 of the plug 31 has a taper shape tapering frontward in the fitting direction, i.e., in the +Y direction as illustrated in FIG. 13, the receptacle 11 and the plug 31 can be correctly fitted even if the receptacle 11 and the plug 31 are slid on each other as being slightly misaligned in the XY plane.

Figure 14:
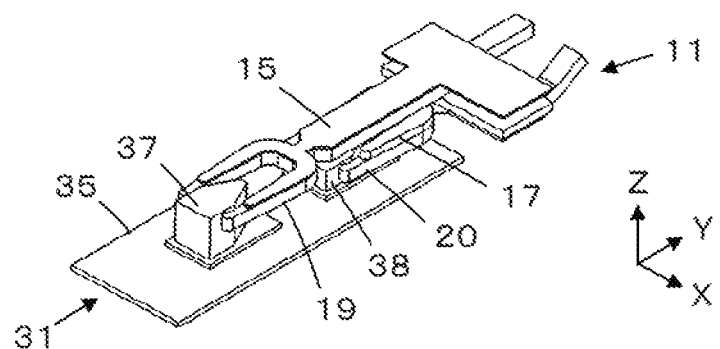
FIG. 14 is a perspective view of the first spring contact and the second spring contact of the receptacle and the first projection and the second projection of the plug when the receptacle and the plug are fitted with other other.
Figure 15:
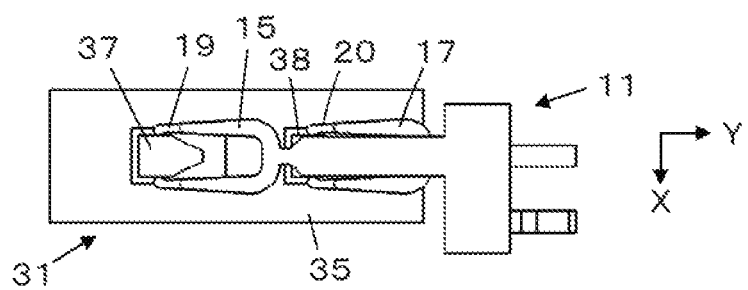
FIG. 15 is a plan view of the first spring contact and the second spring contact of the receptacle and the first projection and the second projection of the plug when the receptacle and the plug are fitted with each other.

Through fitting between the receptacle 11 and the plug 31, the first spring contact 19 of the receptacle 11 shifts in the X direction to hold the first projection 37 of the plug 31 at both sides thereof as illustrated in FIGS. 14 and 15, whereby electrical connection between the first spring contact 19 and the first projection 37 is established.

In addition, since the second spring contact 20 is disposed at the position shifted from the first spring contact 19 in the +Y direction by an amount of $\Delta Y$ in the receptacle 11 while the second projection 38 is disposed at the position also shifted from the first projection 37 in the +Y direction by an amount of $\Delta Y$ in the plug 31, and the second spring contact 20 and the second projection 38 are located at almost the same position in the Z direction, as the first spring contact 19 is electrically connected with the first projection 37, the second spring contact 20 of the receptacle 11 simultaneously shifts in the X direction to hold the second projection 38 of the plug 31 at both sides thereof, whereby electrical connection between the second spring contact 20 and the second projection 38 is established.

In this manner, only through the fitting between one receptacle 11 and one plug 31, the first spring contacts 19 in the first spring contact array R1A of the receptacle 11 are respectively connected to the first projections 37 in the first projection array R2A of the plug 31, and, at the same time, the second spring contacts 20 in the second spring contact array R1B of the receptacle 11 are respectively connected to the second projections 38 in the second projection array R2B of the plug 31. Accordingly, without increasing the width dimension of the receptacle 11 and the plug 31 in the X direction orthogonal to the fitting direction, the number of contacts per unit length in the X direction can be increased, enabling connection with a large number of contacts.

Figure 16:
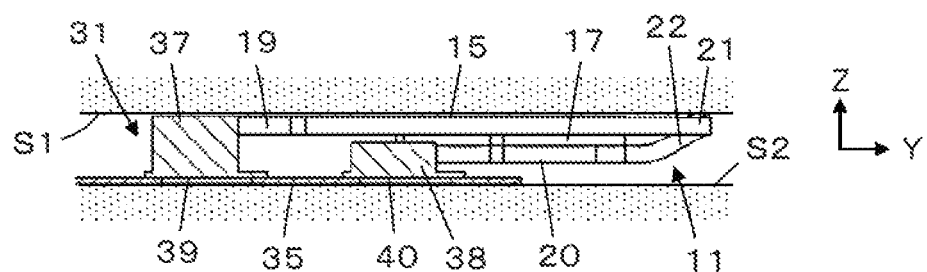
FIG. 16 is a lateral cross-sectional view of the first spring contact and the second spring contact of the receptacle and the first projection and the second projection of the plug when the receptacle and the plug are fitted with each other.
Figure 17:
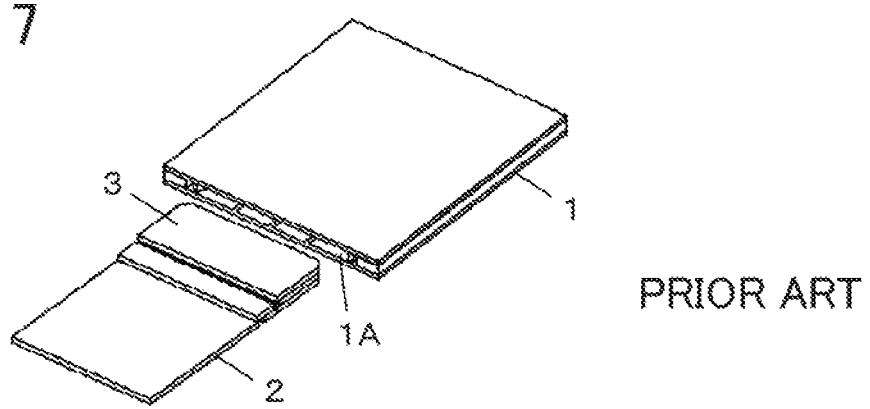
FIG. 17 is a perspective view of a multi-layer board and a plate-like cable in which the conventional connectors are adopted.
Figure 18:
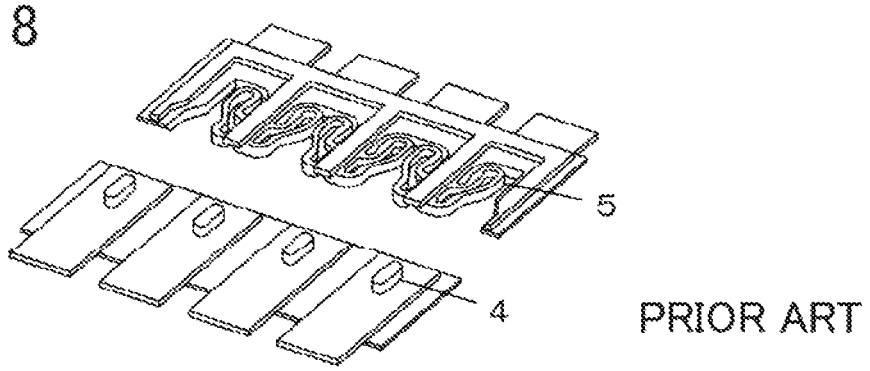
FIG. 18 is a perspective view of columnar terminals and plate-like terminals used in the conventional connectors.
Figure 19:
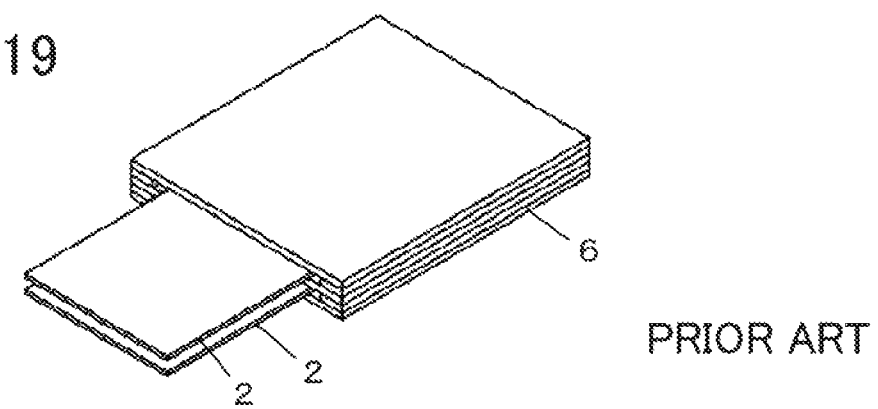
FIG. 19 is a perspective view of the multi-layer board and a plurality of plate-like cables in which conventional connectors are adopted.

As illustrated in FIG. 16, the receptacle 11 is mounted on a first connection subject S1, and the mounting portions 21 and 22 are connected to the corresponding pads of the first connection subject S1, while the plug 31 is mounted on a second connection subject S2, and the mounting portions 39 and 40 are connected to the corresponding pads of the second connection subject S2. Then, by having the receptacle 11 fitted with the plug 31, electrical connection between the first connection subject S1 and the second connection subject S2 can be established.

When the aligning protrusions 34 of the plug 31 are caught in the aligning recesses 14 of the receptacle 11, a part of the receptacle 11 enters between the overhanging portion 34A formed at each of the aligning protrusions 34 and the second insulating layer 35 of the plug 31 so that the receptacle 11 and the plug 31 fitted with each other can be prevented from falling off in the Z direction. In addition, when the aligning protrusions 34 of the plug 31 are caught in the aligning recesses 14 of the receptacle 11, the lock portion 24 formed in each of the aligning recesses 14 of the receptacle 11 enters the recess-like lock receiving portion 42 formed at an end, in the X direction, of each of the aligning protrusions 34 of the plug 31 so that the receptacle 11 and the plug 31 fitted with each other can be prevented from falling off in the Y direction.

Moreover, in the receptacle 11, the respective first and second spring contacts 19 and 20 are protected by the spring contact protecting portions 23 that are each formed between adjacent first spring contacts 19 and second spring contacts 20.

Accordingly, the fitting state of the receptacle 11 with the plug 31 is maintained, and reliable electrical connection between the first spring contacts 19 and the first projections 37 as well as between the second spring contacts 20 and the second projections 38 can be established.

In the embodiment described above, the receptacle 11 has the first spring contacts 19 and the second spring contacts 20 while the plug 31 has the first projections 37 and the second projections 38. Conversely, the connector may be constituted such that the receptacle 11 has the first projections 37 and the second projections 38 while the plug 31 has the first spring contacts 19 and the second spring contacts 20.

In addition, the receptacle 11 has the first and second spring contacts 19 and 20 arranged in two arrays, i.e., the first spring contact array R1A of the first metallic layer 16 disposed on the first insulating layer 15 and the second spring contact array R1B of the second metallic layer 18 disposed on the intermediate insulating layer 17, while the plug 31 has the first and second projections 37 and 38 arranged in two arrays, i.e., the first and second projection arrays R2A and R2B. This is however not a sole case.

For example, a receptacle having three or more arrays of spring contacts respectively formed on three or more first conductive layers and a plug having three or more arrays of projections may be fitted with each other. In such constitution, among the first conductive layers of the receptacle, the first conductive layer closer to the first insulating layer needs to have its spring contact array thereof disposed more frontward in the fitting direction, and the first conductive layer farther from the first insulating layer needs to have its spring contact array disposed more rearward in the fitting direction. Meanwhile, among the projection arrays of the plug, the plurality of projections in the projection array positioned more frontward in the fitting direction needs to have lower heights, and the plurality of projections in the projection array positioned more rearward in the fitting direction needs to have higher heights. By constituting the receptacle and the plug in this manner, a large number of contacts in the three or more arrays can be simultaneously connected, without increasing the width dimension in a direction orthogonal to the fitting direction of the receptacle and the plug, and the number of contacts can be further increased.

What is claimed is:

1. A thin connector comprising a first connector having a flat plate shape and a second connector having a flat plate shape, the first connector and the second connector sliding on each other in a fitting direction to be fitted with each other,
    wherein the first connector includes a plurality of first conductive layers disposed on a first insulating layer and superimposed on one another via an intermediate insulating layer,
    wherein each of the first conductive layers has a spring contact array including a plurality of spring contacts arranged in an arrangement direction crossing the fitting direction,
    wherein, among the plurality of first conductive layers, a first conductive layer closer to the first insulating layer has the spring contact array disposed more frontward in the fitting direction while a first conductive layer farther from the insulating layer has the spring contact array disposed more rearward in the fitting direction,
    wherein the plurality of spring contacts in the spring contact array have spring properties capable of shifting in the arrangement direction and are provided with mounting portions to be connected to a single first connection subject,
    wherein the second connector includes a single second conductive layer disposed on a second insulating layer,
    wherein the second conductive layer has a plurality of projection arrays disposed so as to be shifted from one another in the fitting direction, each of the projection arrays including a plurality of projections arranged in the arrangement direction,
    wherein, among the plurality of projection arrays, the plurality of projections in a projection array disposed more frontward in the fitting direction have lower heights while the plurality of projections in a projection array disposed more rearward in the fitting direction have higher heights,
    wherein the plurality of projections in the projection arrays are provided with mounting portions to be connected to a single second connection subject, and
    wherein, when the first connector and the second connector are fitted with each other with the first insulating layer and the second insulating layer both facing outward, the plurality of spring contacts in each of the spring contact arrays of the first connector are connected to the plurality of projections in a corresponding projection array of the second connector.

2. The thin connector according to claim 1,
    wherein the plurality of first conductive layers of the first connector include: a first metallic layer disposed on the first insulating layer; and a second metallic layer disposed on the first metallic layer via the intermediate insulating layer,
    wherein the first metallic layer has a first spring contact array including a plurality of first spring contacts arranged in the arrangement direction, and the second metallic layer has a second spring contact array including a plurality of second spring contacts arranged in the arrangement direction, the second spring contact array being disposed more rearward in the fitting direction than the first spring contact array of the first metallic layer,
    wherein the second conductive layer of the second connector has a first projection array including a plurality of first projections arranged in the arrangement direction and a second projection array including a plurality of second projections arranged in the arrangement direction, the second projection array being disposed more frontward in the fitting direction than the first projection array, and the plurality of second projections being lower than the first projections, and wherein, when the first connector and the second connector are fitted with each other, the plurality of first spring contacts of the first connector are connected to the plurality of first projections of the second connector, and the plurality of second spring contacts of the first connector are connected to the plurality of second projections of the second connector.

3. The thin connector according to claim 2, wherein, when the first connector and the second connector are fitted with each other, each of the plurality of first spring contacts holds a corresponding first projection at both sides of the first projection, and each of the plurality of second spring contacts holds a corresponding second projection at both sides of the second projection.

4. The thin connector according to claim 2, wherein the first connector has a plurality of spring contact protecting portions each extending along the fitting direction between adjacent first spring contacts and between adjacent second spring contacts.

5. The thin connector according to claim 3, wherein the first connector has a plurality of spring contact protecting portions each extending along the fitting direction between adjacent first spring contacts and between adjacent second spring contacts.

6. The thin connector according to claim 1, wherein one of the first connector and the second connector is provided with a pair of aligning recesses respectively at opposite ends thereof in the arrangement direction, the aligning recesses opening frontward in the fitting direction, wherein another of the first connector and the second connector is provided with a pair of aligning protrusions respectively at opposite ends thereof in the arrangement direction, the aligning protrusions protruding frontward in the fitting direction, and wherein, when the first connector and the second connector are fitted with each other, the pair of aligning protrusions are caught in the pair of aligning recesses.

7. The thin connector according to claim 6, wherein either one of the pair of aligning recesses and the pair of aligning protrusions have overhanging portions overhanging in parallel with the first insulating layer or the second insulating layer, and wherein the other of the pair of aligning recesses and the pair of aligning protrusions enter between the overhanging portions and the first insulating layer or the second insulating layer when the first connector and the second connector are fitted with each other.

8. The thin connector according to claim 6, wherein either one of the pair of aligning recesses and the pair of aligning protrusions have lock portions capable of shifting in the arrangement direction, and wherein the other of the pair of aligning recesses and the pair of aligning protrusions have lock receiving portions, the lock portions being caught in the lock receiving portions when the first connector and the second connector are fitted with each other.

9. The thin connector according to claim 7, wherein either one of the pair of aligning recesses and the pair of aligning protrusions have lock portions capable of shifting in the arrangement direction, and wherein the other of the pair of aligning recesses and the pair of aligning protrusions have lock receiving portions, the lock portions being caught in the lock receiving portions when the first connector and the second connector are fitted with each other.

* * * * *